(12) United States Patent
Hu et al.

(10) Patent No.: US 11,901,469 B2
(45) Date of Patent: Feb. 13, 2024

(54) PHOTODIODE, MANUFACTURING METHOD THEREOF, AND DISPLAY SCREEN

(71) Applicant: Wuhan China Star Optoelectronics Technology Co., Ltd., Hubei (CN)

(72) Inventors: Li Hu, Hubei (CN); Tengteng Shi, Hubei (CN); Guowei Zha, Hubei (CN); Wei Luo, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 767 days.

(21) Appl. No.: 16/975,712

(22) PCT Filed: Jun. 12, 2020

(86) PCT No.: PCT/CN2020/095699
§ 371 (c)(1),
(2) Date: Aug. 26, 2020

(87) PCT Pub. No.: WO2021/139089
PCT Pub. Date: Jul. 15, 2021

(65) Prior Publication Data
US 2023/0101724 A1      Mar. 30, 2023

(30) Foreign Application Priority Data

Jan. 6, 2020   (CN) .......................... 202010008417.8

(51) Int. Cl.
*H01L 31/0224*  (2006.01)
*H01L 31/18*    (2006.01)
(Continued)

(52) U.S. Cl.
CPC .... *H01L 31/022466* (2013.01); *H01L 31/095* (2013.01); *H01L 31/102* (2013.01); *H01L 31/1884* (2013.01); *H01L 31/202* (2013.01)

(58) Field of Classification Search
CPC ......... H01L 31/022466; H01L 31/1828; H01L 31/1884; H01L 31/202; H01L 31/022408;
(Continued)

(56) References Cited

U.S. PATENT DOCUMENTS 11,502,210 B2 * 11/2022 Oooka ................. H10K 71/621
11,670,731 B2 *  6/2023 Lo ....................... H01L 31/0376
                                                             257/40
(Continued)

FOREIGN PATENT DOCUMENTS

CN        102664184       9/2012
CN        108279028       7/2018
(Continued)

*Primary Examiner* — Earl N Taylor

(57) ABSTRACT

The present disclosure provides a photodiode, a manufacturing method thereof, and a display screen. The photodiode includes: a first electrode including a first sub-part and a second sub-part disposed at an interval, wherein the second sub-part includes a first end and a second end; a connecting part disposed on the first sub-part, the first end, and a substrate corresponding to a gap between the first sub-part and the second sub-part; and a light converting part and a second electrode disposed on the second end in sequence.

20 Claims, 2 Drawing Sheets

(51) Int. Cl.
 H01L 31/20 (2006.01)
 H01L 31/102 (2006.01)
 H01L 31/09 (2006.01)
(58) Field of Classification Search
 CPC ........... H01L 31/022475; H01L 31/109; H01L 31/095; Y02E 10/549; G06V 40/1318; H10K 30/10; H10K 30/81; H10K 30/82
 See application file for complete search history.

(56) References Cited

U.S. PATENT DOCUMENTS

| | | | | |
|---|---|---|---|---|
| 2010/0236607 | A1* | 9/2010 | Korevaar | H01L 31/03925 257/E31.008 |
| 2012/0204931 | A1* | 8/2012 | Seike | H10K 39/10 257/E51.012 |
| 2014/0345919 | A1* | 11/2014 | Kim | H01L 31/022491 148/403 |
| 2016/0276611 | A1* | 9/2016 | Oooka | H10K 39/10 |
| 2019/0027499 | A1* | 1/2019 | Li | H01L 31/105 |
| 2019/0081194 | A1* | 3/2019 | Oooka | H01L 31/022483 |
| 2019/0252456 | A1* | 8/2019 | Li | H01L 31/02164 |
| 2020/0403108 | A1* | 12/2020 | Amano | H01L 31/0328 |
| 2020/0411704 | A1* | 12/2020 | Oooka | H01L 31/022483 |
| 2022/0085310 | A1* | 3/2022 | Guo | H10K 39/32 |
| 2023/0101724 | A1* | 3/2023 | Hu | H01L 31/1828 257/431 |

FOREIGN PATENT DOCUMENTS

| | | | |
|---|---|---|---|
| CN | 108321161 | 7/2018 | |
| CN | 108922904 | 11/2018 | |
| CN | 109801569 | 5/2019 | |
| CN | 110277418 | 9/2019 | |
| CN | 111180532 | 5/2020 | |
| WO | WO-2020149842 A1 * | 7/2020 | ........... H01L 27/305 |

* cited by examiner

PHOTODIODE, MANUFACTURING METHOD THEREOF, AND DISPLAY SCREEN

RELATED APPLICATIONS

This application is a National Phase of PCT Patent Application No. PCT/CN2020/095699 having International filing date of Jun. 12, 2020, which claims the benefit of priority of Chinese Patent Application No. 202010008417.8 filed on Jan. 6, 2020. The contents of the above applications are all incorporated by reference as if fully set forth herein in their entirety.

FIELD AND BACKGROUND OF THE INVENTION

The present disclosure relates to the field of display technologies, and more particularly, to a photodiode, a manufacturing method thereof, and a display screen.

In-screen fingerprint recognition uses a photoelectric sensor array which is integrated into a display screen to obtain a fingerprint pattern, and photodiodes are mostly used for current photoelectric sensors. When a finger presses a screen, intensities of reflected light corresponding to protrusions and depressions in a fingerprint are different, and photodiodes can convert obtained light signals into current signals, thereby recognizing fingerprint signals.

However, under light, when a photodiode applies a reverse bias voltage, following currents can be generated: a reverse bias saturation current of the diode generated by minority carriers, a photocurrent of photogenerated carriers, and a leakage current. The leakage current comprises extra holes and electrons generated from defects in a thin film in a depletion zone and a leakage current transmitted from an electrode caused by mismatch in film quality or structures, such as electrons injected from an anode or holes injected from a cathode. When the reverse bias voltage increases, the leakage current may often increase exponentially. It can be understood that current photodiodes have a large leakage current which decreases accuracy of fingerprint information of display screens.

Therefore, it is necessary to provide a photodiode, a manufacturing method thereof, and a display screen to solve the problems in current technology.

SUMMARY OF THE INVENTION

An objective of the present disclosure is to provide a photodiode, a manufacturing method thereof, and a display screen to reduce leakage currents, thereby increasing accuracy of fingerprint information of the display screen.

To solve the above problem, an embodiment of the present disclosure provides a photodiode. The photodiode comprises:
 a substrate;
 a first electrode disposed on the substrate and comprising a first sub-part and a second sub-part disposed at an interval, wherein the second sub-part comprises a first end and a second end;
 a connecting part disposed on the first sub-part, the first end, and the substrate corresponding to a gap between the first sub-part and the second sub-part;
 an electron transport layer disposed on the second end;
 a light converting part disposed on the electron transport layer;
 a hole transport layer disposed on the light converting part; and
 a second electrode disposed on the hole transport layer.

An embodiment of the present disclosure further provides a display screen. The display screen comprises a plurality of above photodiodes.

An embodiment of the present disclosure further provides a manufacturing method of a photodiode. The method comprises:
 manufacturing a first electrode on a substrate and patterning the first electrode to form a first sub-part and a second sub-part disposed at an interval, wherein the second sub-part comprises a first end and a second end;
 manufacturing an electron transport layer on the second end;
 manufacturing an active layer on the electron transport layer, the first sub-part, the second sub-part, and the substrate corresponding to a gap between the first sub-part and the second sub-part;
 patterning the active layer to form a light converting part on the electron transport layer and to form a connecting part on the first sub-part, the first end, and the substrate corresponding to the gap between the first sub-part and the second sub-part;
 manufacturing a hole transport layer on the light converting part; and
 manufacturing a second electrode on the hole transport layer.

The photodiode, the manufacturing method thereof, and the display screen of the present disclosure comprises: a substrate; a first electrode disposed on the substrate and comprising a first sub-part and a second sub-part disposed at an interval, wherein the second sub-part comprises a first end and a second end; a connecting part disposed on the first sub-part, the first end, and the substrate corresponding to a gap between the first sub-part and the second sub-part; an electron transport layer disposed on the second end; a light converting part disposed on the electron transport layer; a hole transport layer disposed on the light converting part; and a second electrode disposed on the hole transport layer. Due to addition of the connecting part, series resistance of the photodiode is increased, thereby reducing leakage currents related to reverse bias voltages and further increasing accuracy of fingerprint signals.

DESCRIPTION OF SPECIFIC EMBODIMENTS OF THE INVENTION

Figure 1:
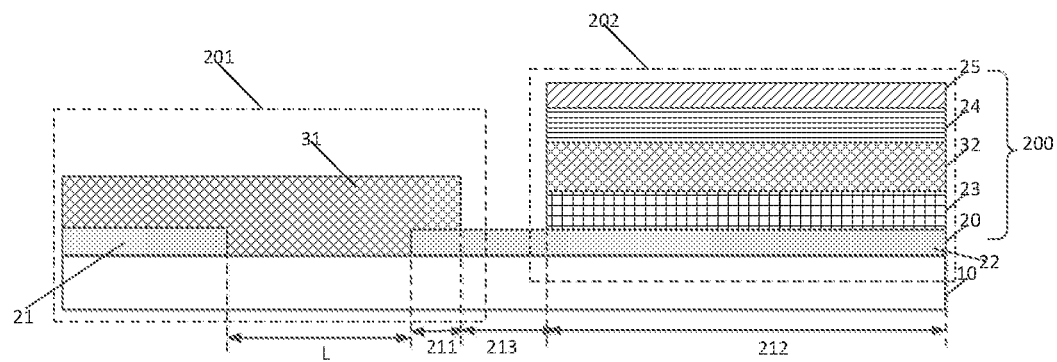
FIG. 1 is a schematic structural diagram of a photodiode according to an embodiment of the present disclosure.

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. The identical or similar reference numerals constantly denote the identical or similar elements or elements having the identical or similar functions in the drawings.

The terms "first", "second", and the like in the description, claims, and the above-mentioned drawings of the present disclosure are used to distinguish different objects, and are not used to describe a specific order. In addition, the term "comprises", "have", and their variations are intended to cover a non-exclusive inclusion.

Figure 2:
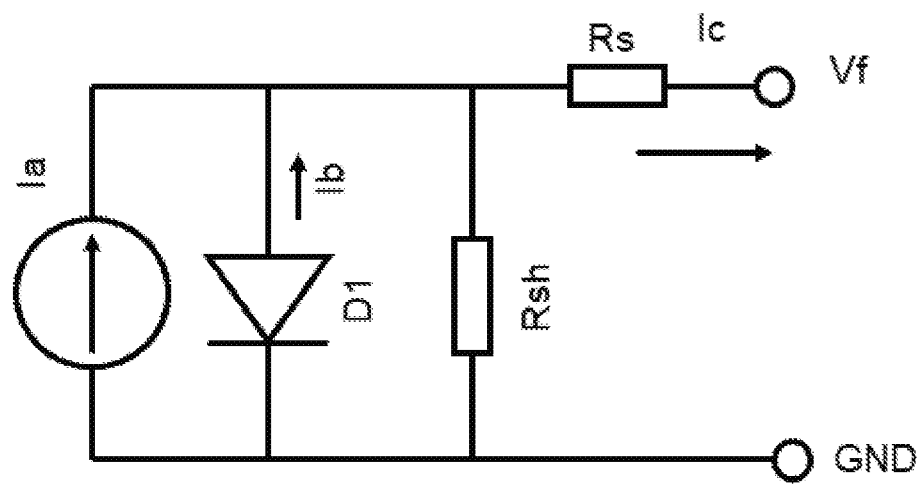
FIG. 2 is an equivalent circuit diagram of a photodiode according to an embodiment of the present disclosure.
Figure 3:
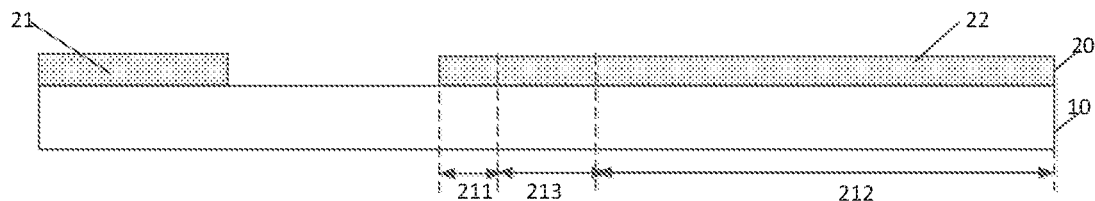
FIG. 3 is a schematic structural diagram of a photodiode in a first step of a manufacturing method of the photodiode according to an embodiment of the present disclosure.

Referring to FIGS. 1 to 3, FIG. 1 is a schematic structural diagram of a photodiode according to an embodiment of the present disclosure.

As shown in FIG. 1, A photodiode 200 of the present disclosure comprises a substrate 10, a first electrode 20, a connecting part 31, an electron transport layer 23, a light converting part 32, a hole transport layer 24, and a second electrode 25.

The first electrode 20 is disposed on the substrate 10 and comprises a first sub-part 21 and a second sub-part 22 disposed at an interval. The second sub-part 22 comprises a first end 211 and a second end 212. Wherein, the second sub-part 22 can also comprise a middle part 213 disposed between the first end 211 and the second end 212.

The connecting part 31 is disposed on the first sub-part 21, the first end 211, and the substrate 10 corresponding to a gap between the first sub-part 21 and the second sub-part 22. The substrate 10 corresponding to the gap between the first sub-part 21 and the second sub-part 22 is the substrate 10 not covered by the first sub-part 21 and the second sub-part 22.

The electron transport layer 23 is disposed on the second end 212 of the first electrode 20.

The light converting part 32 is disposed on the electron transport layer 23, and a material of the light converting part 32 is preferably amorphous silicon. A light absorption rate can be further improved because amorphous silicon has a better light absorption rate in short wavelengths. In an embodiment of the present disclosure, in order to further improve the light absorption rate, a thickness of the light converting part 32 ranges from 40 nm to 1500 nm. In an embodiment of the present disclosure, in order to further improve connection reliability of series resistance, a material of the connecting part 31 is the same as the material of the light converting part 32. For example, the material of the connecting part 31 is also amorphous silicon.

In an embodiment of the present disclosure, the connecting part 31 and the light converting part 32 are manufactured in a same process, thereby simplifying processes, reducing production cost, and improving production efficiency. In other embodiments of the present disclosure, the connecting part 31 and the light converting part 32 can also not be manufactured in the same process.

The hole transport layer 24 is disposed on the light converting part 32. In an embodiment of the present disclosure, in order to further improve the light absorption rate, thicknesses of the electron transport layer 23 and the hole transport layer 24 range from 200 nm to 300 nm. In an embodiment of the present disclosure, in order to further improve the light absorption rate, a material of the hole transport layer 24 and the electron transport layer 23 comprises but is not limited to molybdenum oxide, zinc oxide, tungsten oxide, nickel oxide, titanium oxide, organic semiconductor materials, C60, ICBA, or block copolymers (BCPs).

The second electrode 25 is disposed on the hole transport layer 24. In an embodiment of the present disclosure, when a direction of incident light of the photodiode 200 is a first direction, wherein, for example, the first direction is from bottom to top, that is, a bottom incidence, the first electrode 20 is a transparent conductive material, and the second electrode is a metal material. That is, at this time, the second electrode 25 is a top electrode, the first electrode 20 is a bottom electrode, and the second electrode 25 has reflective function. For example, the second electrode 25 can choose a super thin and transparent metal film as the electrode. The metal material can also be other metal materials. The metal material comprises but is not limited to at least one of molybdenum or titanium. The transparent conductive material can be a transparent conductive oxide and comprises at least one of indium tin oxide (ITO) or indium zinc oxide (IZO).

When the direction of the incident light of the photodiode 200 is a second direction, wherein, for example, the second direction is from top to bottom, that is, a top incidence, that is, at this time, the first electrode 20 is the top electrode, and the second electrode 25 is the bottom electrode, the second electrode 25 is a transparent conductive material and the first electrode 20 is a metal material. The metal material can use the above metal material, and the transparent conductive material also can use the above transparent conductive material. For example, in an embodiment of the present disclosure, a material of the bottom electrode of the photodiode having a bottom incident structure can use ITO, and a material of the top electrode can use molybdenum. For the photodiode having a top incident structure, the material of the top electrode can use ITO, and the material of the bottom electrode can use titanium.

Because the top electrode is a metal material and the bottom electrode is a transparent conductive material, light can be transmitted to a light converting layer from the bottom electrode and can be reflected to the light converting layer from the top electrode without transmitting outside, thereby increasing light received by the light converting layer and improving the light absorption rate and photoelectric conversion efficiency. Of course, it can be understood that the materials of the first electrode 20 and the second electrode 25 also can be other materials.

In an embodiment of the present disclosure, in order to further improve the light absorption rate, thicknesses of the first electrode 20 and the second electrode 25 range from 40 nm to 300 nm.

The photodiode 200 in the embodiment is equivalent to including a series resistance part 201 and a body part 202. The body part 202 is used to achieve the function of the photodiode 200 and the series resistance part 201 is use to reduce the leakage current related to reverse bias voltages.

That is, the series resistance part 201 is equivalent to a series resistance under the top view.

As shown in FIG. 2, a current source Ia simulates a photocurrent, an ideal diode D1 simulates rectification effect of the photodiode, a series resistance Rs simulates the series resistance of the photodiode, and a parallel resistance Rsh simulates the leakage current of the photodiode. Two connecting ends are connected to reverse bias voltages Vf and GND, and the two connecting ends represent the anode and the cathode of the photodiode. The reverse bias voltage Vf is a negative value.

When under reverse bias, the photocurrent Ia has a same direction with a reverse bias saturation current Ib of the diode and remains unchanged. Due to existences of Rs and Rsh, the leakage current Ic is generated from the connecting end, and specifically has following formula:

$$Ic = Vf/(Rsh + Rs)$$

It can be understood that the leakage current is directly related to the reverse bias voltage, and increasing a value of the series resistance Rs can reduce the leakage current related to the reverse bias voltage.

In order to further increase the series resistance, the gap L between the first sub-part 21 and the second sub-part 22 is in a first predetermined range, and a thickness of the connecting part 31 is in a second predetermined range. Both the first predetermined range and the second predetermined range can be set according to experiences. In an embodiment of the present disclosure, the gap between the first sub-part 21 and the second sub-part 22 and the thickness of the connecting part 31 are set according to a predetermined resistance value. The predetermined resistance value can make the above leakage current meet the predetermined requirements, thereby improving accuracy of fingerprint signals.

Taking the material of the light converting part being amorphous silicon for example, the above photodiode uses amorphous silicon as a photosensitive material. When light is emitted to the amorphous silicon layer from outside, photons will be converted into pairs of electrons and holes, then the pairs of electrons and holes are separated, and electrons and holes are separately collected by the first electrode and the second electrode, thereby generating photocurrents. In an embodiment of the present disclosure, the first electrode is an anode and the second electrode is a cathode.

An embodiment of the present disclosure further provides a display screen. The display screen comprises a plurality of above photodiodes. The plurality of photodiodes form a photoelectric sensor array. In addition, the display screen can also comprise a display panel disposed under the photodiodes. The display panel can comprise a switch array layer which includes a plurality of thin film transistors.

When a finger presses a screen, intensities of reflected light corresponding to protrusions and depressions in a fingerprint are different, so intensity distribution of photocurrents of the overall sensor array can be obtained, thereby obtaining fingerprint patterns. In the sensor array, there is a capacitance in each pixel to store charges in the photocurrents, and the stored charges will be read by an external circuit. Information of intensity distribution of light of the panel can be obtained by acquiring intensity distribution of charges in storage capacitors of the all array, thereby obtaining fingerprint information according to the information of intensity distribution of light. Because the photodiode of the present disclosure has a higher light absorption rate, the accuracy of fingerprint signals is further improved.

An embodiment of the present disclosure further provides a manufacturing method of a photodiode. The method comprises:

step S101: manufacturing a first electrode on a substrate and patterning the first electrode to form a first sub-part and a second sub-part disposed at an interval, wherein the second sub-part comprises a first end and a second end.

In an embodiment of the present disclosure, as shown in FIG. 3, manufacturing a first electrode 20 on a substrate 10 and patterning the first electrode 20 to form a first sub-part 21 and a second sub-part 22 disposed at an interval. Wherein, the second sub-part 22 comprises a first end 211 and a second end 212. The patterning process can comprise steps of exposure, developing, and etching.

Step S102: manufacturing an electron transport layer on the second end.

Figure 4:
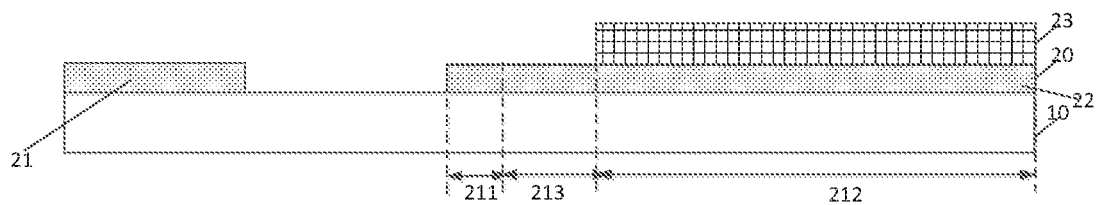
FIG. 4 is a schematic structural diagram of a photodiode in a second step of a manufacturing method of the photodiode according to an embodiment of the present disclosure.

As shown in FIG. 4, manufacturing an electron transport layer 23 on the second end 212.

Step S103: manufacturing an active layer on the electron transport layer, the first sub-part, the second sub-part, and the substrate corresponding to a gap between the first sub-part and the second sub-part.

Figure 5:
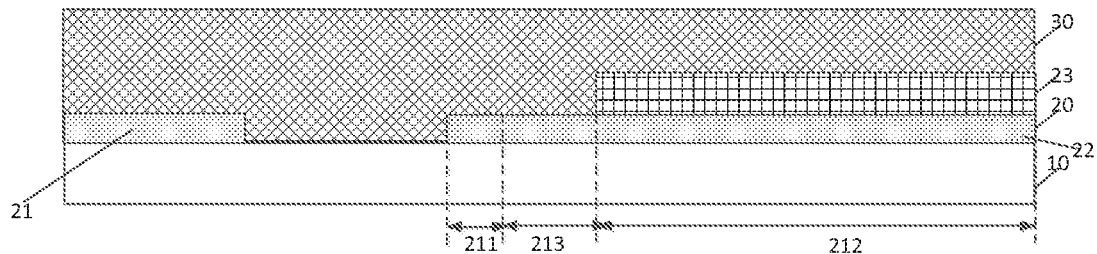
FIG. 5 is a schematic structural diagram of a photodiode in a third step of a manufacturing method of the photodiode according to an embodiment of the present disclosure.

For example, as shown in FIG. 5, manufacturing an active layer 30 on the electron transport layer 23, the first sub-part 21, the second sub-part 22, and the substrate 10 corresponding to a gap between the first sub-part 21 and the second sub-part 22.

Step S104: patterning the active layer to form a light converting part on the electron transport layer and to form a connecting part on the first sub-part, the first end, and the substrate corresponding to the gap between the first sub-part and the second sub-part.

Figure 6:
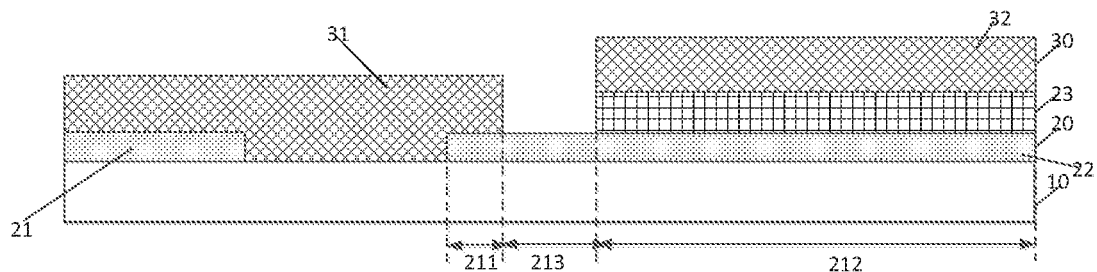
FIG. 6 is a schematic structural diagram of a photodiode in a fourth step of a manufacturing method of the photodiode according to an embodiment of the present disclosure.

As shown in FIG. 6, patterning the active layer 30 to form a light converting part 32 on the electron transport layer 23 and to form a connecting part 31 on the first sub-part 21, the first end 211, and the substrate 10 corresponding to the gap between the first sub-part 21 and the second sub-part Step S105: manufacturing a hole transport layer on the light converting part.

Figure 7:
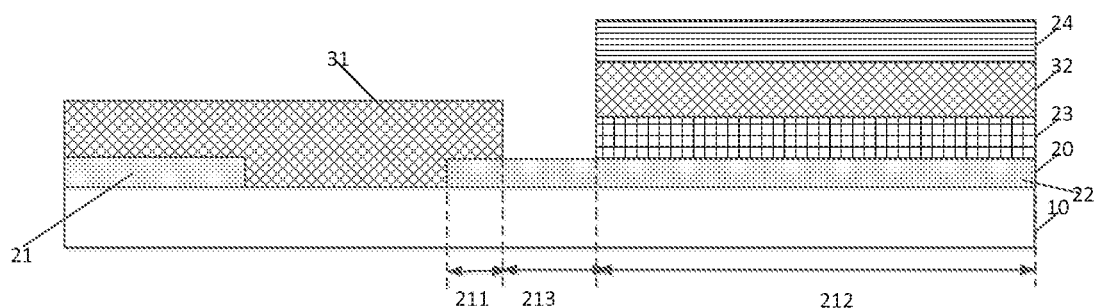
FIG. 7 is a schematic structural diagram of a photodiode in a fifth step of a manufacturing method of the photodiode according to an embodiment of the present disclosure.

For example, as shown in FIG. 7, manufacturing a hole transport layer 24 on the light converting part 32.

Step S106: manufacturing a second electrode on the hole transport layer.

For example, referring back to FIG. 1, manufacturing a second electrode 25 on the hole transport layer 24.

In an embodiment of the present disclosure, in order to reduce the leakage current related to the reverse bias voltage, the gap between the first sub-part 21 and the second sub-part 22 and a thickness of the connecting part 31 are defined according to a predetermined resistance value, thereby making a value of the series resistance meet requirements of processes.

It can be understood that the manufacturing method of the photodiode of the present disclosure is not limited thereto.

The photodiode, the manufacturing method thereof, and the display screen of the present disclosure comprises: a substrate; a first electrode disposed on the substrate and comprising a first sub-part and a second sub-part disposed at an interval, wherein the second sub-part comprises a first end and a second end; a connecting part disposed on the first sub-part, the first end, and the substrate corresponding to a gap between the first sub-part and the second sub-part; an electron transport layer disposed on the second end; a light converting part disposed on the electron transport layer; a hole transport layer disposed on the light converting part; and a second electrode disposed on the hole transport layer. Due to addition of the connecting part, series resistance of the photodiode is increased, thereby reducing leakage currents related to reverse bias voltages and further increasing accuracy of fingerprint signals.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A photodiode, comprising:
a substrate;
a first electrode disposed on the substrate and comprising a first sub-part and a second sub-part disposed at an interval, wherein the second sub-part comprises a first end and a second end;
a connecting part disposed on the first sub-part, the first end, and the substrate corresponding to a gap between the first sub-part and the second sub-part, wherein the connecting part connects the first sub-part with the first end to form a series resistance part;
an electron transport layer disposed on the second end;
a light converting part disposed on the electron transport layer;
a hole transport layer disposed on the light converting part; and
a second electrode disposed on the hole transport layer.

2. The photodiode according to claim 1, wherein the connecting part and the light converting part are manufactured in a same process.

3. The photodiode according to claim 1, wherein the connecting part and the light converting part comprise a same material.

4. The photodiode according to claim 3, wherein the connecting part comprises amorphous silicon.

5. The photodiode according to claim 1, wherein the gap between the first sub-part and the second sub-part is in a first predetermined range, and a thickness of the connecting part is in a second predetermined range.

6. The photodiode according to claim 1, wherein the second sub-part further comprises a middle part disposed between the first end and the second end.

7. The photodiode according to claim 1, wherein when a direction of incident light of the photodiode is a first direction, the first electrode comprises a transparent conductive material and the second electrode comprises a metal material; and
when the direction of the incident light of the photodiode is a second direction, the second electrode comprises the transparent conductive material and the first electrode comprises the metal material.

8. A display screen including a photodiode, comprising:
a substrate;
a first electrode disposed on the substrate and comprising a first sub-part and a second sub-part disposed at an interval, wherein the second sub-part comprises a first end and a second end;
a connecting part disposed on the first sub-part, the first end, and the substrate corresponding to a gap between the first sub-part and the second sub-part, wherein the connecting part connects the first sub-part with the first end to form a series resistance part;
an electron transport layer disposed on the second end;
a light converting part disposed on the electron transport layer;
a hole transport layer disposed on the light converting part; and
a second electrode disposed on the hole transport layer.

9. The display screen according to claim 8, wherein the connecting part and the light converting part are manufactured in a same process.

10. The display screen according to claim 8, wherein the connecting part and the light converting part comprise a same material.

11. The display screen according to claim 10, wherein the connecting part comprises amorphous silicon.

12. The display screen according to claim 8, wherein the gap between the first sub-part and the second sub-part is in a first predetermined range, and a thickness of the connecting part is in a second predetermined range.

13. The display screen according to claim 8, wherein the second sub-part further comprises a middle part disposed between the first end and the second end.

14. The display screen according to claim 8, wherein when a direction of incident light of the photodiode is a first direction, the first electrode comprises a transparent conductive material and the second electrode comprises a metal material; and
when the direction of the incident light of the photodiode is a second direction, the second electrode comprises the transparent conductive material and the first electrode comprises the metal material.

15. The display screen according to claim 14, wherein the metal material comprises at least one of molybdenum or titanium.

16. The display screen according to claim 14, wherein the transparent conductive material comprises at least one of indium tin oxide (ITO) or indium zinc oxide (IZO).

17. A manufacturing method of a photodiode, comprising:
manufacturing a first electrode on a substrate and patterning the first electrode to form a first sub-part and a second sub-part disposed at an interval, wherein the second sub-part comprises a first end and a second end;
manufacturing an electron transport layer on the second end;
manufacturing an active layer on the electron transport layer, the first sub-part, the second sub-part, and the substrate corresponding to a gap between the first sub-part and the second sub-part;
patterning the active layer to form a light converting part on the electron transport layer and to form a connecting part on the first sub-part, the first end, and the substrate corresponding to the gap between the first sub-part and the second sub-part, wherein the connecting part connects the first sub-part with the first end to form a series resistance part;
manufacturing a hole transport layer on the light converting part; and
manufacturing a second electrode on the hole transport layer.

18. The manufacturing method of the photodiode according to claim 17, wherein the gap between the first sub-part and the second sub-part and a thickness of the connecting part are defined according to a predetermined resistance value.

19. The manufacturing method of the photodiode according to claim 17, wherein the connecting part comprises amorphous silicon.

20. The manufacturing method of the photodiode according to claim 17, wherein when a direction of incident light of the photodiode is a first direction, the first electrode comprises a transparent conductive material and the second electrode comprises a metal material; and when the direction of the incident light of the photodiode is a second direction, the second electrode comprises the transparent conductive material and the first electrode comprises the metal material.

\* \* \* \* \*